Figure 1:
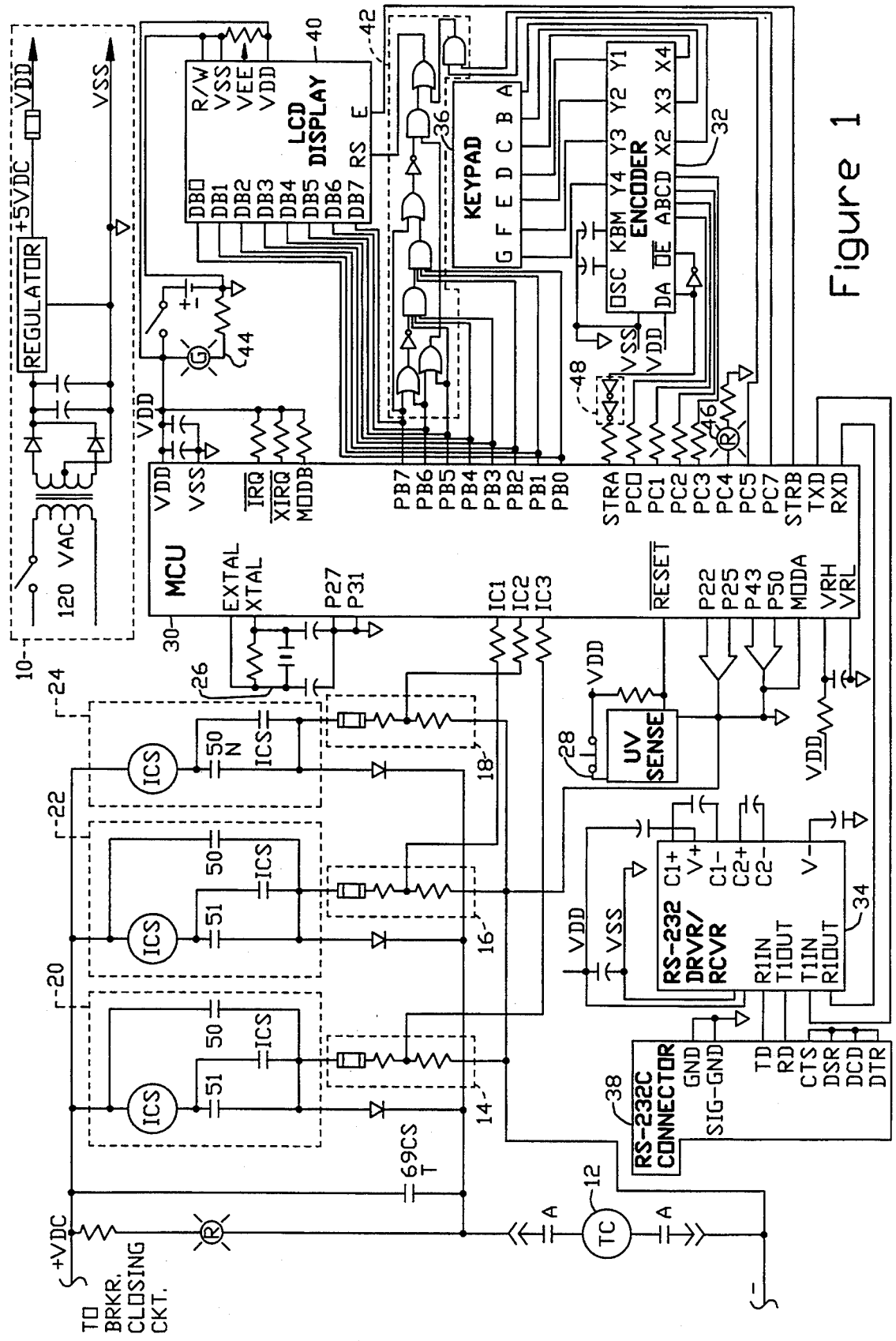

United States Patent [19]
Moore

[11] Patent Number: 5,451,879
[45] Date of Patent: Sep. 19, 1995

[54] ELECTROMECHANICAL RELAY MONITORING SYSTEM WITH STATUS CLOCKING

[76] Inventor: Clayton K. Moore, 6521 Charingwood Dr. N., Mobile, Ala. 36695

[21] Appl. No.: 930,622

[22] Filed: Aug. 14, 1992

[51] Int. Cl.6 .................. G01R 31/00; G07C 1/00; H01H 47/00; G08B 29/00
[52] U.S. Cl. .................... 324/418; 324/422; 324/512; 324/113; 340/644; 346/60; 361/166; 361/191; 377/15
[58] Field of Search ............ 324/102, 103 R, 113, 324/415–424, 500, 509, 512, 537, 555; 340/644, 825.16, 825.18; 361/166, 191; 364/483; 346/59, 60; 377/15, 16, 20

[56] References Cited

U.S. PATENT DOCUMENTS

| | | | |
|---|---|---|---|
| 3,004,817 | 10/1961 | Wapner | 346/59 X |
| 3,011,162 | 11/1961 | Byrnes | . |
| 3,108,262 | 10/1963 | Saba | . |
| 3,371,349 | 2/1968 | Schinner | 346/60 |
| 3,611,364 | 10/1971 | Jones | 340/644 X |
| 3,678,344 | 7/1972 | Wedmore | 340/644 X |
| 3,872,473 | 3/1975 | Melgaard et al. | . |
| 4,110,684 | 8/1978 | Gale | 324/102 X |
| 4,311,960 | 1/1982 | Barr | 324/113 X |
| 4,470,041 | 9/1984 | Sutherland et al. | 340/644 |
| 4,484,180 | 11/1984 | Deforeit | 340/644 X |
| 4,589,074 | 5/1986 | Thomas et al. | 364/483 |
| 4,616,216 | 10/1986 | Meirow et al. | 340/644 |
| 4,634,842 | 1/1987 | Payne | 340/644 X |
| 4,845,692 | 7/1989 | Groslambert et al. | . |
| 4,918,390 | 4/1990 | Ziv et al. | . |
| 4,959,831 | 9/1990 | Wroblewski | . |
| 5,016,982 | 5/1991 | Fergason et al. | . |

OTHER PUBLICATIONS

Westinghouse, MMCO Microprocessor Multiphase Overcurrent Relay, 1989 November, Information Brochure.

Primary Examiner—Gerard R. Strecker

[57] ABSTRACT

An improved monitoring system which identifies the particular event (contact operation) and therefore the particular electromechanical relay (20, 22, and 24 which operated). This information is output from a MCU (30), along with the relative time the event occurred, to a PC and an LCD display (40). In addition, the relative occurrence time is recorded to the thousandths of a second.

2 Claims, 1 Drawing Sheet

Microfiche Appendix Included
(1 Microfiche, 60 Pages)

1

ELECTROMECHANICAL RELAY MONITORING SYSTEM WITH STATUS CLOCKING

REFERENCE

Microfiche appendix of software program having one microfiche of sixty frames.

BACKGROUND-FIELD OF INVENTION

This invention relates to monitoring systems, specifically to such systems which are used for monitoring electromechanical relays.

BACKGROUND-DISCUSSION OF PRIOR ART

Electromechanical protective relays are commonly supplied on switchgear breakers. Such relays indicate an operation by allowing a mechanical target to physically drop. Frequently operators forget to reset them and they are known to malfunction.

Originally monitoring systems used contact operation to de-energize control relays causing indicating lights to be turned on or off. U.S. Pat. Nos. 3,011,162 to Byrnes (1958) and 3,108,262 to Saba (1960) describe such systems which require numerous relays and indicating lights. These systems disclose no other trip information and have no communication ability.

Thereafter, inventors created several types of systems which monitored contacts or switches for location. U.S. Pat. No. 3,872,473 to Melgaard et al. (1975) only indicates the initial contact to drop out and no others. U.S. Pat. No. 4,959,831 to Wroblewski (1990) only indicates in the form of a keypad address. U.S. Pat. No. 4,918,390 to Ziv et al. (1990) requires the electrical switches to be connected in parallel. None of these systems has communication ability or displays trip times.

Byrnes requires multiple transformers and diode bridges, and Saba discloses multiple power sources. Ziv et at. requires current and voltage to be monitored. Although none of the previous systems has communication ability, they also require electrical switches or contacts to be actuated for operation. These numerous disadvantages are in addition to the lack of real-time clocking which provides when an operation occurred.

U.S. Pat. No. 4,845,692 to Groslambert et al. (1989) is not a monitoring system but rather a clocking device with frequency stability. No actuated switches or contacts are monitored and no real-time clocking is output.

Some solid state relays only provide trip times to seconds. The clock is required to be an integral part of the relay. Again, contact actuation is used to supervise tripping.

No system is disclosed which concurrently displays multiple trip locations with trip times. Finally, no system has been disclosed which randomly monitors electromechanical relays for relatively concurrent and sequential operations.

OBJECTS AND ADVANTAGES

Accordingly, several objects and advantages of my invention are:
(a) to provide a system which will monitor electromechanical relays;
(b) to provide a trip indicator without moving parts;
(c) to provide a reliable trip indicator and monitoring system;
(d) to provide a system which will have passive sensing;
(e) to provide a system which can sense either energization or de-energization for inputs;
(f) to provide a system which will indicate not only location but also trip times;
(g) to provide a system which can display multiple trip operations concurrently;
(h) to provide a stand-alone relay monitoring system;
(i) to provide a system which can monitor independent sensors;
(j) to provide a system which can communicate;
(k) to provide a system with a single power supply; and
(l) to provide a system whose clocking will present superior trip times.

Further objects and advantages of my invention will become apparent from a consideration of the drawing and ensuing description.

DRAWING FIGURES

FIG. 1 shows a detailed electronic connection diagram.

REFERENCE NUMERALS IN DRAWING

| | | | |
|---|---|---|---|
| 10 | power supply | 32 | encoder |
| 12 | trip coil | 34 | RS-232 driver/receiver |
| 14 | voltage divider | 36 | keypad |
| 16 | voltage divider | 38 | RS-232C connector |
| 18 | voltage divider | 40 | display |
| 20 | electromechanical relay | 42 | logic gates |
| 22 | electromechanical relay | 44 | battery, switch, and green indicating light emitting diode |
| 24 | electromechanical relay | | |
| 26 | oscillator | 46 | red indicating light emitting diode |
| 28 | reset controller | | |
| 30 | microcontroller unit | 48 | inverters |

SUMMARY

The invention provides a system for monitoring a plurality of electromechanical relays. The trip times of the relays are displayed in milliseconds.

DESCRIPTION

A typical embodiment of the monitoring system of the present invention is illustrated in FIG. 1. A 120 volt AC supply is connected to a transformer-rectifier-regulator circuit power supply 10 which provides 5 volts DC to the monitoring system. Power supply 10 transforms, rectifies, and regulates power to produce 5 volts DC for VDD bus. The neutral of power supply 10 is used for the system ground bus VSS. Other appropriate 5 volt DC power supplies can be utilized instead of a transformed 120 volt AC supply.

A trip coil 12 is connected to electromechanical relays 20, 22, and 24 through current and voltage dividers 14, 16, and 18. In the preferred embodiment, voltage dividers 14, 16, and 18 are connected to a microcontroller unit (MCU) 30.

However, the input connections to MCU 30 can consist of any logic level approximate 5 volt DC source. An important advantage is that voltage dividers 14, 16, and 18 can be retrofitted to existing or installed in new switchgear breakers. Another is that while FIG. 1 depicts voltage dividers 14, 16, and 18 in the same switchgear breaker, they can be easily installed in three separate breakers. This allows for comparison of breaker operational sequence. Since the voltage of the tripping circuit can vary such as 48 volts DC, 125 volts DC, 250 volts DC, and capacitance trip device voltage which is on a 120 or 240 volt AC control breaker, voltage dividers' 14, 16, and 18 resistor values are not specified. The bottom resistors of voltage dividers 14, 16, and 18 are sized to obtain approximately 5 volts DC. A large combined resistor value such as ten megohms provides a passive element to the circuit. Therefore, the resistors don't interfere with the breaker operation.

MCU 30 is a single chip unit which contains a CPU, ON-chip clock, input/output interface I/O, ROM, RAM, and a timer, such as a Motorola MC68HC711E9. An 8 MHz oscillator 26 which controls the ON-chip clock is connected to MCU 30 utilizing a bus clock speed of 2 MHz.

An undervoltage sensor such as a Motorola MC34064, with a momentary normally closed push button is used as a reset controller 28. Reset controller 28 connects to MCU 30.

MCU 30 is connected to a sixteen-key encoder 32, through inverters 48, which connects to a twelve button keypad 36. MCU 30 also connects to a RS-232 driver/receiver 34 which is connected to a RS-232C connector 38.

Logic gates 42 are connected to MCU 30 and to a display 40 such as an Optrex liquid crystal display (LCD) DMC 20434. Display 40 has four lines with twenty characters on each line. Display 40 also connects to MCU 30.

An appropriate 5 volt DC battery, switch, and green indicating light emitting diode (LED) 44 are connected to VDD to indicate when DC power is applied to the system and also to provide a battery back-up power supply so one can still obtain the trip information upon loss of power to the monitoring system.

A red indicating light emitting diode (LED) 46 is also connected to MCU 30 to indicate when data is output to display 40.

OPERATION

Power is supplied from power supply 10 to the system and MCU 30 starts executing an installed program stored in ROM. Green LED 44 starts blinking as soon as power is applied to MCU 30.

The program initializes the CPU registers and memory. Display 40 is initialized. For particular LCD display 40, logic gates 42 are required for signaling from MCU 30.

Data is sent and received through RS-232C connector 38 via RS-232 driver/receiver 34 to determine whether a personal computer (PC) attached to RS-232C connector 38, or the keypad 36 will be used to set the time of day in hours, minutes, and seconds. A delay in the output of trip times to display 40 can also be input. This information is entered from a PC through RS-232C connector 38, or from keypad 36 through time delay inverters 48 and encoder 32, to MCU 30 and displayed on the PC and on display 40. The program then scans the output of voltage dividers 14, 16, and 18 for a signal. The program continues to scan the inputs during the delay time after a trip for any further trips, and displays all the trip operations concurrently at the end of the delay.

Oscillator 26 functions at 8 MHz which allows MCU 30 to operate with a bus speed of 2 MHz. Therefore MCU 30 scans fast enough to clock time in the milliseconds. When electromechanical relays 20, 22, and 24 on different breakers are closely coordinated or miscoordinated, trip times in the milliseconds are required to differentiate the fault occurrence and breaker operational sequence. Their operation can not be differentiated by their time-current (coordination) curves because of proximity.

A switchgear breaker opens when trip coil 12 is energized through closed auxiliary switch contacts A. When electromechanical relays 20, 22, and 24 operate due to a fault or faults, the instantaneous 50 or overcurrent 51 contacts close. This completes the tripping circuit energizing trip coil 12 and thus opening the breaker. Once the breaker opens the tripping circuit is deenergized.

When the contacts close from electromechanical relays 20, 22, and 24, voltage dividers 14, 16, and 18 are also energized producing exclusive signals or signal depending upon which electromechanical relays 20, 22, and 24 operated.

The signals are read by the program in MCU 30 and relative times of day in hours, minutes, seconds, tenths, hundredths, and thousandths of a second are recorded and matched to the particular event (contact operation) producing each signal. This data is displayed on the PC and on display 40. When this data is displayed, red LED 46 starts blinking.

Keypad 36 can be used to clear display 40 and the PC without having to re-enter the current time of day. The system is therefore ready for the next fault condition. A complete reset can be achieved by reset controller 28 either sensing an undervoltage condition on VDD or by depressing the push button. As soon as clock time is again entered, the system is ready for the next fault occurrence.

CONCLUSION, RAMIFICATIONS, AND SCOPE

Accordingly, the reader will see that the monitoring system of this invention can be used to monitor a plurality of inputs in real time. Specifically, the application to electromechanical relays is very useful to industrial plant personnel to provide them with valuable information on the electrical distribution system chronology during fault conditions. Not only would this information verify relay operation and correlate coordination settings, but it would also allow for the development of the fault occurrence scenario and the power system's reaction. A typical 60 Hz cycle has a period of approximately 16.7 milliseconds and switchgear breakers operate on the order of several cycles such as 5. Also, a time-current (coordination) curve's origin begins at 0.01 second on the log-log scale. Therefore, timing in the range of milliseconds is crucial for differentiation and timing in the range of seconds is meaningless when operation occurs of closely coordinated breakers. Furthermore, the monitoring system has the additional advantages in that:

- it provides a trip indicator without moving parts;
- it provides a reliable trip indicator and monitoring system;
- it provides a system which has passive sensing;
- it provides a system which can sense either energization or de-energization for inputs;
- it provides a system which can indicate not only location but also trip times;
- it provides a system which can display multiple trip operations concurrently;
- it provides a stand-alone relay monitoring system;
- it provides a system which can monitor independent sensors and therefore independent breakers;

it provides a system which can communicate;

it provides a system with a single power source; and it provides a system whose clocking presents superior trip times in the millisecond range.

Although the description above contains many specificities, these should not be construed as limiting the scope of the invention but as merely providing an illustration of the presently preferred embodiment of this invention. For example, the monitoring system can have other configurations, such as the addition of multiplexers to accept numerous sensing signals, relays to operate devices such as alarms, or the sensing signals could be obtained from DC to DC converters or optically isolated, etc. The inputs could be used as motion sensor signals for intrusion protection systems, etc.

Depending upon the type of display, the logic gates could be removed as well as the encoder for no or a different type of keypad. Other components which could be removed include the battery or power supply, the LCD display, the inverters, and the RS-232C connector and the RS-232 driver/receiver for communication, etc.

Thus the scope of the invention should be determined by the appended claims and their legal equivalents, rather than by the example given.

I claim:

1. A method of timing and recording the random operation of a plurality of electromechanical relays, comprising:

monitoring said plurality of electromechanical relays in an amount of time effective to distinguish their operational sequence; and recording and displaying in hours, minutes, seconds, tenths, hundredths and thousandths of a second, the relative times of day at which each of said operating relays has operated to distinguish the chronology of relative concurrent and sequential relay operations.

2. A relay monitoring system comprising:

a. A means for randomly sensing signals produced relatively concurrently and sequentially by the operation of a plurality of electromechanical relays;

b. means responsive to said sensing means for recording in hours, minutes, seconds, tenths, hundredths and thousandths of a second the relative times of day at which each of said operating relays has operated as determined from said sensed signals, and c. means for displaying the relative multiple operation times concurrently with identification of the relays operating at said times.

* * * * *